(12) United States Patent
Kanno (10) Patent No.: US 7,551,478 B2
(45) Date of Patent: Jun. 23, 2009

(54) APPARATUS, METHOD AND COMPUTER PROGRAM PRODUCT FOR READING INFORMATION STORED IN STORAGE MEDIUM

(75) Inventor: Shinichi Kanno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 11/531,963

(22) Filed: Sep. 14, 2006

(65) Prior Publication Data
US 2007/0174740 A1 Jul. 26, 2007

(30) Foreign Application Priority Data
Nov. 1, 2005 (JP) .............................. 2005-318803

(51) Int. Cl.
*G11C 16/06* (2006.01)
(52) U.S. Cl. .................................. 365/185.09; 714/763
(58) Field of Classification Search .................. 714/763; 365/185.09
See application file for complete search history.

(56) References Cited

U.S. PATENT DOCUMENTS

| | | | |
|---|---|---|---|
| 5,128,944 A * | 7/1992 | Flaherty et al. ................. 714/6 |
| 5,233,559 A * | 8/1993 | Brennan, Jr. ............ 365/185.09 |
| 5,243,570 A * | 9/1993 | Saruwatari .................... 365/63 |
| 5,377,147 A * | 12/1994 | Merchant et al. ........ 365/185.09 |
| 5,428,621 A * | 6/1995 | Mehrotra et al. ............. 714/721 |
| 5,517,634 A * | 5/1996 | Ehrlich ........................ 711/166 |
| 5,671,239 A * | 9/1997 | Higashitani et al. ......... 714/805 |
| 5,748,527 A * | 5/1998 | Lee et al. ................. 365/185.09 |
| 5,761,128 A * | 6/1998 | Watanabe ............... 365/189.15 |
| 5,774,396 A * | 6/1998 | Lee et al. ................. 365/185.09 |
| 5,883,903 A * | 3/1999 | Higashitani .................. 714/710 |
| 5,909,449 A | 6/1999 | So et al. |
| 5,920,508 A * | 7/1999 | Miyakawa et al. ...... 365/185.22 |
| 6,108,250 A * | 8/2000 | Kengeri ....................... 365/200 |
| 6,469,932 B2 * | 10/2002 | Roohparvar et al. ... 365/185.09 |
| 6,711,056 B2 * | 3/2004 | Abedifard et al. ....... 365/185.09 |
| 6,771,541 B1 * | 8/2004 | Park ....................... 365/185.22 |
| 7,450,435 B2 * | 11/2008 | Tran et al. ............... 365/185.29 |
| 2002/0034097 A1 * | 3/2002 | Banks ................... 365/185.03 |
| 2005/0237814 A1 * | 10/2005 | Li et al. .................. 365/185.28 |
| 2005/0265081 A1 * | 12/2005 | Tran et al. ............... 365/185.29 |
| 2007/0130496 A1 | 6/2007 | Kanno |
| 2007/0174740 A1 | 7/2007 | Kanno |

OTHER PUBLICATIONS

U.S. Appl. No. 11/360,604, filed Feb. 24, 2006, Shinichi Kanno.

* cited by examiner

*Primary Examiner*—M. Mujtaba K Chaudry
(74) *Attorney, Agent, or Firm*—Oblon, Spivak, McClelland, Maier & Neustadt, P.C.

(57) ABSTRACT

An apparatus for reproducing information includes a memory unit which stores charge; a reading unit which obtains an amount of the charge stored in the memory unit, and reads information by determining a value based on a comparison of the amount of the charge with a first threshold; an error detection unit which determines whether the information read has an error; and a threshold generation unit which generates a second threshold having a value different from that of the first threshold used in reading the information, when the error detection unit determines that the information has an error, wherein the reading unit further reads the information by determining a value based on a comparison of the amount of the charge with the second threshold after the error detection unit determines that the information has the error.

13 Claims, 11 Drawing Sheets

4-LEVEL

FIG.2B

8-LEVEL

| SETTING ID | Eth2 (V) | Eth1 (V) | Eth0 (V) |
|---|---|---|---|
| 1 | 0.83 | 0.50 | 0.17 |
| 2 | 0.75 | 0.45 | 0.15 |
| 3 | 0.67 | 0.40 | 0.14 |
| 4 | 0.60 | 0.36 | 0.12 |

FIG.12 even in the readout and writing operations are not performed for a long time, a state in which the information readout is disabled is easy to occur particularly when a non-volatile memory is not turned on for a long time. In the multiple-value memory, the discharge has a large influence on the decrease in output of the memory device, which causes the readout number to be restricted.

APPARATUS, METHOD AND COMPUTER PROGRAM PRODUCT FOR READING INFORMATION STORED IN STORAGE MEDIUM

CROSS-REFERENCE TO RELATED APPLICATIONS

This application is based upon and claims the benefit of priority from the prior Japanese Patent Application No. 2005-318803, filed on Nov. 1, 2005; the entire contents of which are incorporated herein by reference.

BACKGROUND OF THE INVENTION

1. Field of the Invention

The present invention relates to an apparatus, a method, and a computer program product for reading information stored in a storage medium.

2. Description of the Related Art

Recently there is widely known a semiconductor memory device such as a flash memory in which information is stored according to held charge amount. There has also been developed a multiple-value memory technology in which information on at least two bits is stored by setting plural thresholds of the charge amount.

In a charge accumulation type memory device, as time passes, and with each readout operation, discharge is performed due to a parasitic resistor of the memory device and an input resistor of a sense amplifier. Because a decrease in charge accumulation amount caused by natural discharge is generated even in the readout and writing operations are not performed for a long time, a state in which the information readout is disabled is easy to occur particularly when a non-volatile memory is not turned on for a long time. In the multiple-value memory, the discharge has a large influence on the decrease in output of the memory device, which causes the readout number to be restricted.

Therefore, for example, in a technology disclosed in U.S. Pat. No. 5,909,449, an output voltage of the memory device is detected before the state in which the information readout is disabled, and the output voltage is kept such that the information is correctly read by performing a refresh operation in which the information storage is re-started when the output voltage is lowered.

However, in the method disclosed in U.S. Pat. No. 5,909,449, when the output voltage of the memory device is largely lowered after a long time passes from the writing, there is a problem that the normal information for being written in the refresh operation cannot be read from a group of memory devices. Therefore, the refresh operation cannot be performed to the memory device in which a long time passes from the writing, which results in the problem that the information cannot normally be read.

SUMMARY OF THE INVENTION

According to one aspect of the present invention, an apparatus for reproducing information includes a memory unit which stores charge; a reading unit which obtains an amount of the charge stored in the memory unit, and reads information by determining a value based on a comparison of the amount of the charge with a first threshold; an error detection unit which determines whether the information read has an error; and a threshold generation unit which generates a second threshold having a value different from that of the first threshold used in reading the information, when the error detection unit determines that the information has an error, wherein the reading unit further reads the information by determining a value based on a comparison of the amount of the charge with the second threshold after the error detection unit determines that the information has the error.

According to another aspect of the present invention, a method for reproducing information includes obtaining an amount of the charge stored in a memory unit which stores charge; reading information by determining a value based on a comparison of the amount of the charge with a first threshold; determining whether the information read has an error; generating a second threshold different from the first threshold used in reading the information when it is determined that the information has the error; and reading the information by determining a value based on a comparison of the amount of the charge with the second threshold after it is determined that the information has the error.

A computer program product according to still another aspect of the present invention causes a computer to perform the method according to the present invention.

DETAILED DESCRIPTION OF THE INVENTION

Exemplary embodiments of an apparatus, a method, and a storage medium reproducing program for reproducing information according to the present invention will be described in detail below with reference to the accompanying drawings.

In an apparatus for reproducing information according to a first embodiment, an error of readout information is detected, and a threshold for determining a code stored in the memory device is changed to read the information again when the error is detected.

Figure 1:
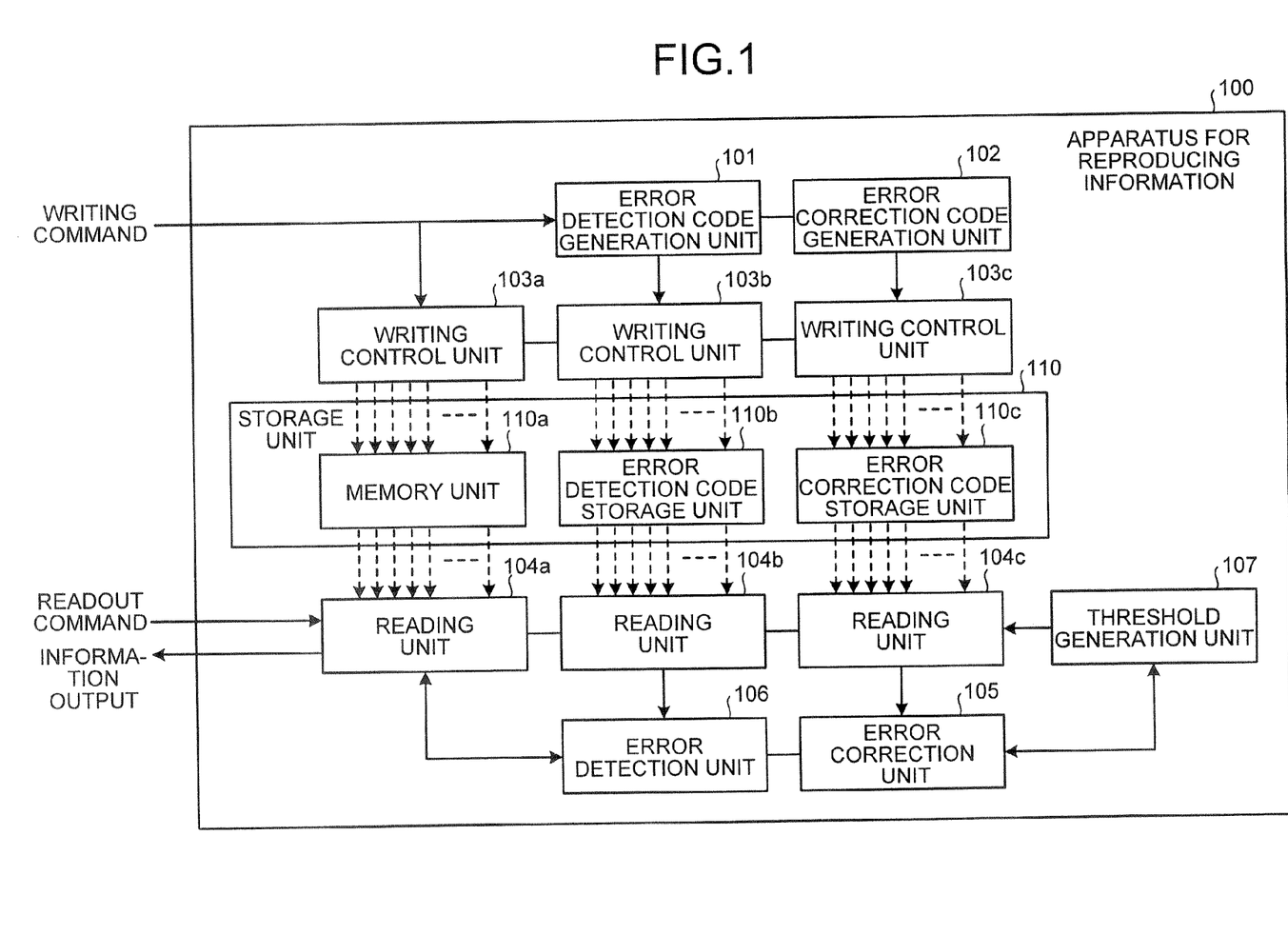
FIG. 1 is a block diagram showing a configuration of an apparatus for reproducing information according to a first embodiment.

FIG. 1 is a block diagram showing a configuration of an apparatus for reproducing information 100 according to a first embodiment. As shown in FIG. 1, an apparatus for reproducing information 100 comprises a memory unit 110, an error detection code generation unit 101, an error correction code generation unit 102, writing control units 103*a* to 103*c*, reading units 104*a* to 104*c*, an error correction unit 105, an error detection unit 106, and a threshold generation unit 107.

The memory unit 110 is the memory device in which the information is stored according to the charge amount with respect to a predetermined threshold of the charge amount. The memory unit 110 can be formed by a generally utilized semiconductor memory such as flash memory and a DRAM (Dynamic Random Access Memory). The memory unit 110 may be formed by a binary memory device. The binary memory device has one threshold, and a binary value of "0" or "1" is stored in the binary memory device. The memory unit 110 may also be formed by a multiple-value memory device having plural thresholds. An example in which the memory unit 110 is formed by a four-value memory device having three thresholds will be described below.

The memory unit 110 includes an information storage unit 110*a*, an error detection code storage unit 110*b*, and an error correction code storage unit 110*c*. The information storage unit 110*a* is a memory unit having plural memory cells which are of the four-value memory device, and the information stored in the memory unit 110 is stored in the information storage unit 110*a*.

Similarly to the information storage unit 110*a*, the error detection code storage unit 110*b* is a memory unit having plural memory cells which are of the four-value memory device. An error detection code corresponding to the stored information is stored in the error detection code storage unit 110*b*.

Similarly to the information storage unit 110*a*, the error correction code storage unit 110*c* is the memory unit having plural memory cells which are of the four-value memory device. An error correction code corresponding to the stored information is stored in the error correction code storage unit 110*c*.

Figure 2A:
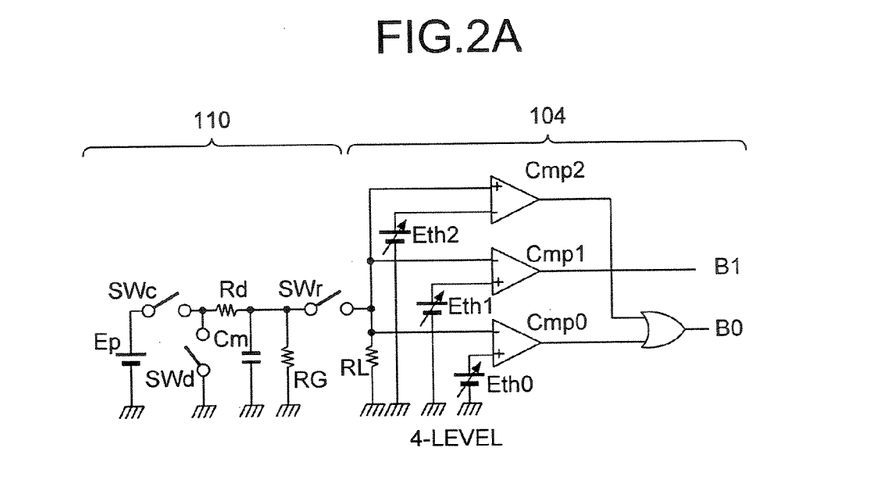
FIG. 2 is an explanatory view showing an example of an equivalent circuit of a memory device constituting a memory unit.
Figure 2B:
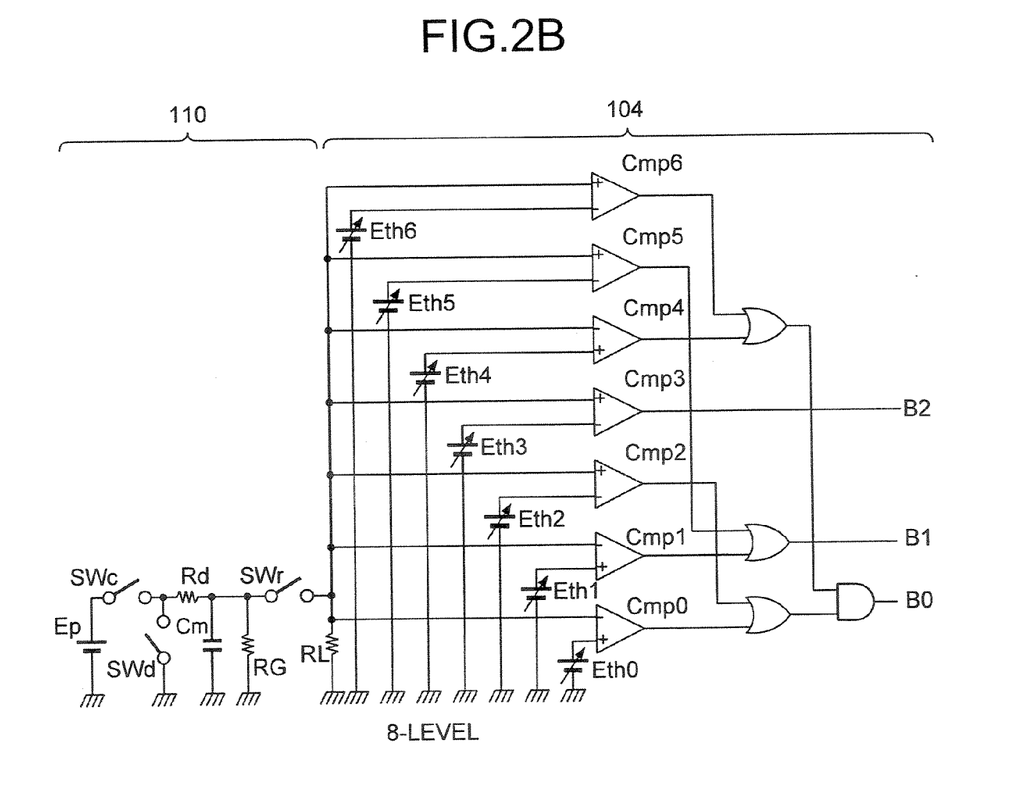

FIG. 2 is an explanatory view showing an example of an equivalent circuit of the memory device constituting the memory unit 110. FIG. 2A shows the equivalent circuit of the four-value memory device, and FIG. 2B shows the equivalent circuit of the eight-value memory device.

The circuit on the right side of FIG. 2 shows the equivalent circuit of the later-mentioned reading units 104*a* to 104*c*. The circuit on the left side of FIG. 2 shows the equivalent circuit of the memory device in which the charge is accumulated. Although only one memory device is shown in FIG. 2, actually the memory unit 110 includes the plural memory devices in parallel. That is, a part of the plural memory devices corresponds to the information storage unit 110*a*, other parts correspond to the error detection code storage unit 110*b* and the error correction code storage unit 110*c*, and the plural memory devices constitute the memory unit 110 as a whole.

In the case of the four-value memory device, two-bit information of bit B0 and B1 can be output by comparing the accumulated charge amount to the three thresholds with a comparator, which enables four-value information (01, 00, 10, and 11) to be stored.

Examples of the memory device which can be shown by the equivalent circuit of FIG. 2 include an EEP-ROM (Electrically Erasable Programmable Read Only Memory), a flash memory, and the DRAM. In such memory devices, the information is expressed by the charge amount accumulated in a capacitor Cm of FIG. 2. A resistor Rd has a relatively low resistance value. A resistor RG is a parasitic resistor generated due to a device configuration, and the resistor RG has a high resistance value.

The charge accumulated in the capacitor Cm can be discharged through the resistor Rd in a short time when a switch SWd is turned on. For example, the discharge operation is performed in erasing the EEP-ROM or the flash memory. When the discharge is ended, a switch SWc is released.

In storing the information in the memory device, after the erasing operation is performed once, the charge having a specified amount is charged in the capacitor Cm by turning a switch SWc. For example, when four values (two bits) are stored, the charge amount is specified based on the voltage between both ends of the capacitor Cm in full charge such that the code "11" is 0%, the code "10" is 33%, the code "00" is 67%, and the code "01" is 100%. The accumulated charge amount is controlled by adjusting a time during which the switch SWc is turned on according to the stored code, and the information is stored.

The charge amount allocated in each code is not limited to the rate shown in the above example, but the charge amount may be configured to increase or decrease according to characteristics of the memory device. The method of adjusting the charge amount is not limited to the above example, but any method can be adopted as long as the adjustment is performed such that the predetermined specified charge amount is stored.

In the readout, each code is determined by turning on a switch SWr to compare each code to predetermined threshold voltages (Eth0, Eth1, and Eth2). When the determination is ended, the switch SWr is turned off.

In the first embodiment, the information is stored and reproduced in parallel to the many memory devices. When the information is stored in the many memory devices, a variation in characteristics is generated among the memory devices due to a production reason.

Figure 3:
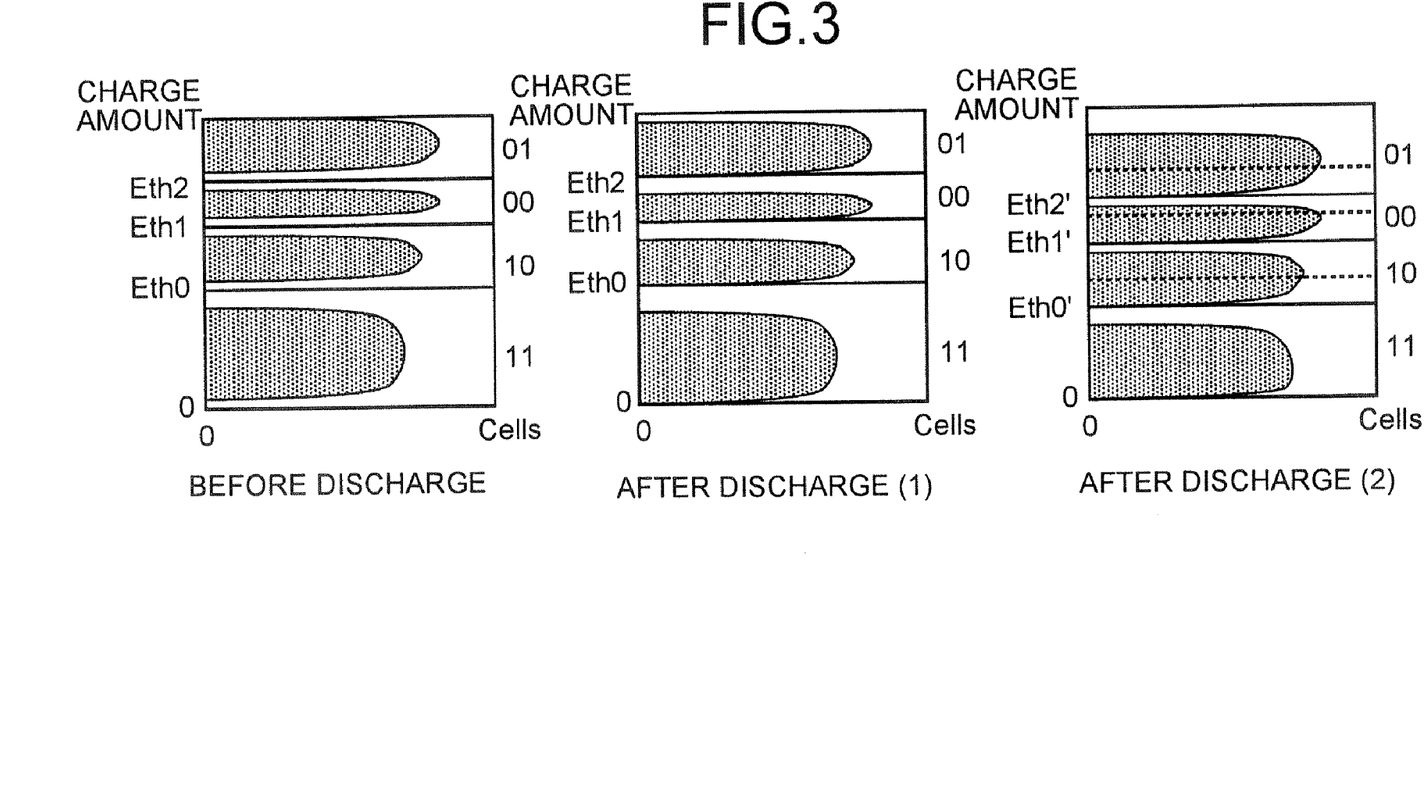
FIG. 3 is an explanatory view showing an example of a charge amount distribution of the memory device.

FIG. 3 is an explanatory view showing an example of a charge amount distribution of the memory device. The left side of FIG. 3 shows the charge amount distribution immediately after the write, and the center of FIG. 3 shows the charge amount distribution after the time elapses. The right side of FIG. 3 shows the charge amount distribution after the time further elapses. The signs Eth0 to Eth2 designate the threshold of the charge amount.

As shown in FIG. 3, the charge amount of each memory device is distributed in a range having a certain extent of width immediately after the information storage, a threshold voltage for separating the codes can be determined in consideration of the distribution. However, the charge of the capacitor Cm is gradually discharge by resistor RG and RL in association with passage of the time or the information readout, and the output voltage is brought close to the threshold voltage in some memory devices as shown in the center of FIG. 3. When the output voltage is decreased lower than the threshold, the code value of the memory device is wrongly determined.

In the first embodiment, when the error of the information readout is generated, the value of the threshold voltage is changed to read the information again, and this operation is repeated until the information is normally read. Therefore, even if the discharge is generated due to the passage of the time, the information can normally be read.

The error detection code generation unit 101 generates the error detection code of the information in an information writing process. Any conventional method such as a CRC (Cyclic Redundancy Check) code (CRC16, CRC32, and the like) and Checksum can be applied to a method of generating the error detection code as long as a detection code which can detect whether the stored information is wrong or not is generated.

In the information writing process, the error correction code generation unit 102 generates an error correction code from the information in which the stored information and the error detection code generated by the error detection code generation unit 101 are combined. Any conventional method such as a BCH (Bose-Chaudhuri-Hocquenghem) code and an RS (Reed-Solomon) code can be applied to a method of generating the error correction code as long as the error correction can instantly be performed.

The apparatus for reproducing information 100 may be configured such that only the error detection is performed while the error correction is not performed. In this case, the error correction code generation unit 102, the error correction code storage unit 110c, and the later-mentioned error correction unit 105 are not required.

The error detection code and error correction code generated by the error detection code generation unit 101 and error correction code generation unit 102 respectively are stored in a group of memory devices constituting the memory unit 110 along with the stored information. For example, when the error correction is performed up to four bits including the correction code using the BCH code while the CRC16 is used for the error detection, 16 bits and 48 bits are necessary to the error detection and the error correction respectively. That is, the storage capacity necessary to the error detection code storage unit 110b is 16 bits and the storage capacity necessary to the error correction code storage unit 110c is 48 bits.

When the information of 2048 bits is stored in the information storage unit 110a, in the group of memory devices constituting the memory unit 110, 2112 bit (=2048+16+48) is necessary to the storage capacity of the stored information, the error detection code, and the error correction code.

The memory units 110 are arranged in parallel and the components except for the memory units 110 are commonly used, which allows the large-capacity storage device to be realized. That is, the group of memory devices is formed in one unit (for example, 2112 bits) of the stored information, the error detection code, and the error correction code, and the plural groups of memory devices are arranged in parallel. In writing processes and readout processes, the writing control units 103a to 103c and the reading units 104a to 104c are connected to each of the plural groups of memory devices by switching from group to group.

The writing control units 103a to 103c control an information writing process, an error detection code writing process, and an error correction code writing process to the memory unit 110. The writing control units 103a, 103b, and 103c perform the writing processes to the information storage unit 110a, the error detection code storage unit 110b, and the error correction code storage unit 110c respectively.

The reading units 104a to 104c read the information from the memory unit 110 by comparing the threshold voltage and the charge amount stored in the memory unit 110. A value by which the code can normally be determined immediately after writing the information is used as an initial value of the threshold voltage.

The reading units 104a, 104b, and 104c read the information from the information storage unit 110a, the error detection code storage unit 110b, and the error correction code storage unit 110c respectively.

When the error exists in the information read by the later-mentioned error detection unit 106, the reading units 104a to 104c read the information by re-comparing the charge amount stored in the memory unit 110 to the new threshold voltage generated by the later-mentioned threshold generation unit 107.

The error correction unit 105 performs an error correction process using the error correction code read by the reading unit 104c. The error correction process is performed to the information in which the information read from the information storage unit 110a and the error detection code read from the error detection code storage unit 110b are combined. Any conventional error correction technology such as the BCH code and the RS code can be applied to the error correction in the first embodiment.

The error detection unit 106 determines whether the error is included in the information read by the reading unit 104a and corrected by the error correction unit 105 using the error detection code read by the reading unit 104b and corrected by the error correction unit 105. Any conventional error detection technology such as the CRC code and Checksum can be applied to the error detection in the first embodiment. In the case of the configuration in which the error correction is not performed, the error detection unit 106 determines whether the error is included in the information read by the reading unit 104a.

When the error detection unit 106 detects that the error exists in the readout information, the threshold generation unit 107 generates a threshold voltage having a value different from that of the threshold voltage used in the comparison at that time. In the initial readout, the threshold generation unit 107 generates an initial value of the threshold voltage in which the code can normally be determined immediately after the writing.

Figure 4:
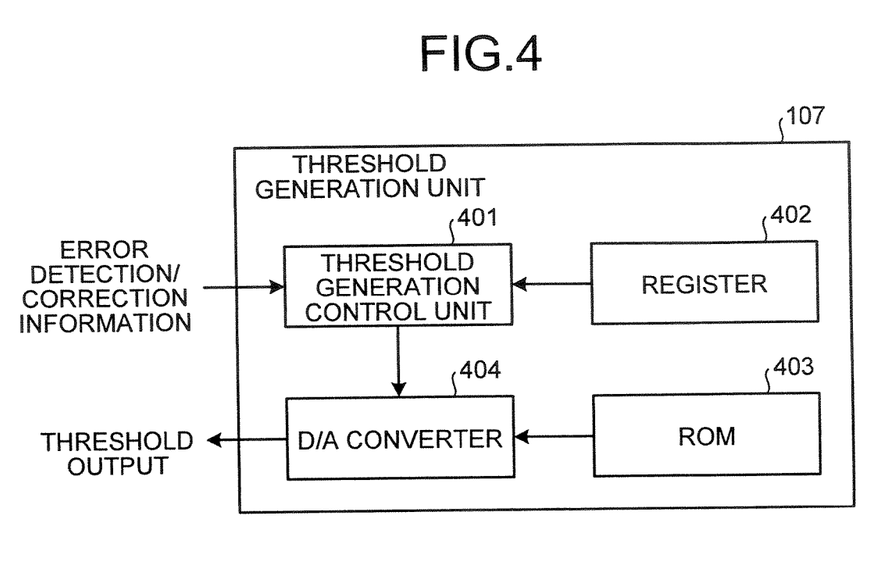
FIG. 4 is a block diagram showing a detailed configuration of a threshold generation unit.

FIG. 4 is a block diagram showing a detailed configuration of the threshold generation unit 107. As shown in FIG. 4, the threshold generation unit 107 includes a threshold generation control unit 401, a register 402, a ROM (Read Only Memory) 403, and a D/A (Digital/Analog) converter 404.

The threshold generation control unit 401 is a control unit which controls a threshold generation process. The register 402 is a memory unit in which the value of the currently used threshold voltage is stored. The ROM 403 is a memory unit which stores the plural predetermined sets of threshold voltages. The memory unit which stores the plural sets of threshold voltages may be configured to be provided outside the threshold generation unit 107.

Figure 5:
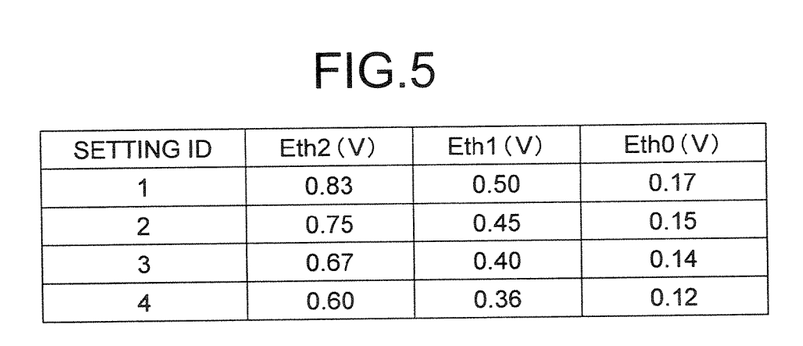
FIG. 5 is an explanatory view showing a storage example of a set of threshold voltages stored in a ROM.

FIG. 5 is an explanatory view showing a storage example of the set of threshold voltages stored in the ROM 403. As shown in FIG. 5, a setting ID for uniquely identifying the set of threshold voltages, and the threshold voltages (Eth2, Eth1, and Eth0) are stored in the ROM 403 while corresponding to one another.

In the sets of threshold voltages, the set of threshold voltages in which the code can be determined with no error immediately after the writing is specified as the initial value of the threshold voltage. In the example shown in FIG. 5, the set of setting ID=1 is specified as the initial value. In the set of setting ID=1, threshold Eth2 is set at 0.83, threshold Eth1 is set at 0.50, and threshold Eth0 is set at 0.17. That is, in the output value of the memory device, it is assumed that 1.00 (V) is output for the code "01" (full charge), 0.67 (V) is output for the code "00", 0.33 (V) is output for the code "10", and 0.00 (V) is output for the code "11".

It is desirable that the threshold voltage values stored in the ROM 403 be adjusted according to discharge characteristics of the memory device such that the determination error lessened. The four sets of threshold voltages adjusted according to the discharge characteristics are shown in FIG. 5.

The D/A converter 404 converts the threshold voltage values stored in the ROM 403 into analog signals to output the analog signal such that the reading units 104a to 104c can use the threshold voltage values for the comparison.

When the error is detected, the threshold generation control unit 401 refers to the setting value of the current threshold voltage stored in the register 402, and the threshold generation control unit 401 selects the setting value different from the current setting value to store the setting value in the register 402. The selection method is arbitrary, for example, the threshold generation control unit 401 is configured to randomly select the setting value.

Because of the application of the error detection and the error correction, the readout numbers of the memory devices included in the groups of memory devices are similar to one another. Therefore, it can be thought that the memory devices in the group of the memory devices are substantially similar to one another in the discharge amount of accumulation charge, so that the same threshold voltage is used for the memory devices included in the same group of memory devices.

Figure 6:
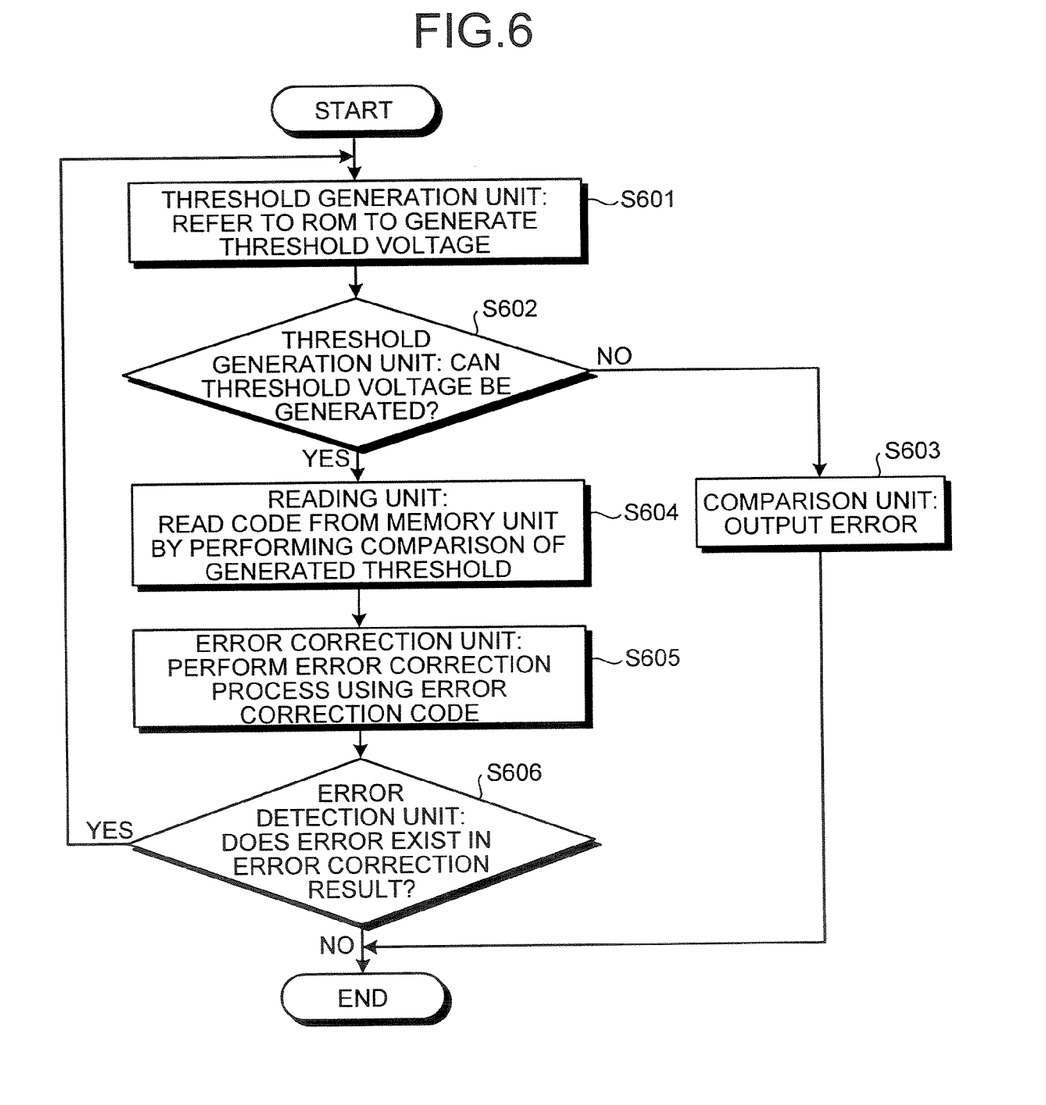
FIG. 6 is a flowchart showing a whole flow of an information readout process in the first embodiment.

An information readout process performed by the apparatus for reproducing information 100 of the first embodiment having the above configuration will be described below. FIG. 6 is a flowchart showing a whole flow of the information readout process in the first embodiment.

The threshold generation unit 107 refers to the ROM 403 to generate the threshold voltage used for the comparison by the reading units 110a to 104c (Step S601). In the initial comparison process, in response to the readout command, the threshold generation unit 107 obtains the initial value of the threshold voltage from the ROM 403 to generate the threshold voltage.

The threshold generation unit 107 determines whether the threshold voltage can be generated or not (Step S602). When the threshold voltage cannot be generated (No in Step S602), the reading units 104a to 104c output the error generation (Step S603), and the information readout process is ended.

As used herein, that the threshold voltage cannot be generated shall mean that all the candidates of the threshold voltages stored in the ROM 403 are run out. This corresponds to the case in which the information cannot normally be read because the discharge makes progress even if the information is read with any threshold voltage.

When the threshold voltage can be generated (Yes in Step S602), the reading units 104a to 104c compare the threshold voltage to the threshold voltage generated by the threshold generation unit 107, which reads the code from the memory unit 110 (Step S604).

The error correction unit 105 performs the error correction process using the error correction code read by the reading unit 104c (Step S605). The error correction unit 105 performs the error correction to the information in which the information read from the information storage unit 110a by the reading unit 104a and the error detection code read from the error detection code storage unit 110b by the reading unit 104b are combined.

The error detection unit 106 determined whether the error exists in the result of the error correction process performed by the error correction unit 105 (Step S606). Specifically the error detection unit 106 determines whether the error exists or not by applying the error detection code, read by the reading unit 104b and corrected by the error correction unit 105, to the information which is read by the reading unit 104a and corrected by the error correction unit 105.

When the error exists (Yes in Step S606), the threshold generation unit 107 obtains the threshold voltage having the value different from that of the current threshold voltage from the ROM 403, and the threshold generation unit 107 newly generates the threshold voltage (Step S601), and the information readout process is repeated.

The threshold generation unit 107 randomly selects the value of newly generated threshold voltage from the ROM 403. The number of threshold voltage values is finite even if the selection is randomly performed, so that the proper threshold voltage value can be generated at high speed with a simple circuit configuration.

The threshold generation unit 107 may be configured to select the newly generated threshold voltage value such that the threshold voltage is decreased. This can deal with the monotonous decrease in output voltage, because the charge accumulated in the memory device is simply discharged unless the storage is re-treated.

For example, assuming that threshold voltage settings shown in FIG. 5 are stored in the ROM 403, when the threshold voltage of the setting ID=1 is currently used, the threshold voltage of the setting ID=2 is generated as the new threshold voltage values, which allows the proper threshold voltage to be generated at higher speed.

In Step S606, when the threshold generation unit 107 determines that the error does not exist (No in Step S606), the information readout process is ended because the information is normally read.

Thus, in the apparatus for reproducing information of the invention, the error of the readout information is detected, and the information can be read again by changing the threshold for determining the code stored in the memory device when the error is detected. Even in the memory device in which the discharge makes progress, the information can normally be read. Therefore, a period during which the information can normally be read and the readout number can be increased.

In an apparatus for reproducing information according to a second embodiment, the threshold is stored when the error is not detected in the readout information, and the speed-up of the information readout process is achieved by referring to the threshold in the subsequent readouts.

Figure 7:
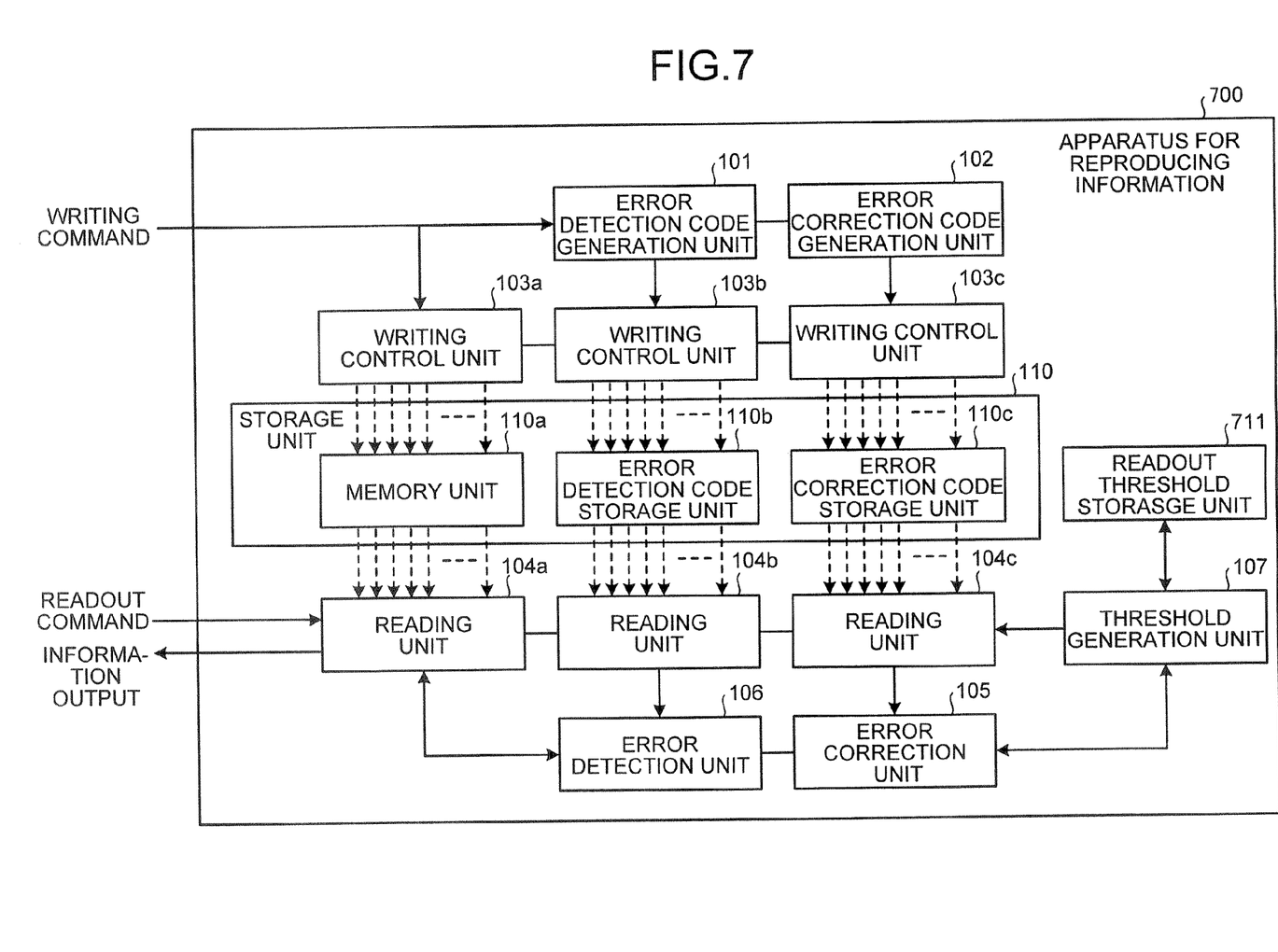
FIG. 7 is a block diagram showing a configuration of an apparatus for reproducing information according to a second embodiment.

FIG. 7 is a block diagram showing a configuration of an apparatus for reproducing information 700 according to a second embodiment. As shown in FIG. 7, the apparatus for reproducing information 700 includes the memory unit 110, a readout threshold storage unit 711, the error detection code generation unit 101, the error correction code generation unit 102, the writing control units 103a to 103c, the reading units 104a to 104c, the error correction unit 105, the error detection unit 106 and a threshold generation unit 707.

The second embodiment differs from the first embodiment in addition of the readout threshold storage unit 711 and the function of the threshold generation unit 707. Other configurations and functions are similar to those of the block diagram of FIG. 1 which shows the configuration of the apparatus for reproducing information 100 of the first embodiment. Therefore, the same component is designated by the same reference numeral, and the description will be not repeated.

The readout threshold storage unit 711 is a memory unit in which the threshold voltage value is stored when the information is normally read.

The threshold generation unit 707 stores the threshold voltage value, used at that value, in the threshold storage unit 711 when the information is normally read. The threshold generation unit 707 generates the threshold voltage corresponding to the value stored in the readout threshold storage unit 711 when the information is read next.

Therefore, the duration of before normally reading the information can be shortened to enhance the speed of the readout process. It is assumed that the readout threshold storage unit 711 returns the threshold voltage to the initial value when the writing is performed to the group of memory device.

Figure 8:
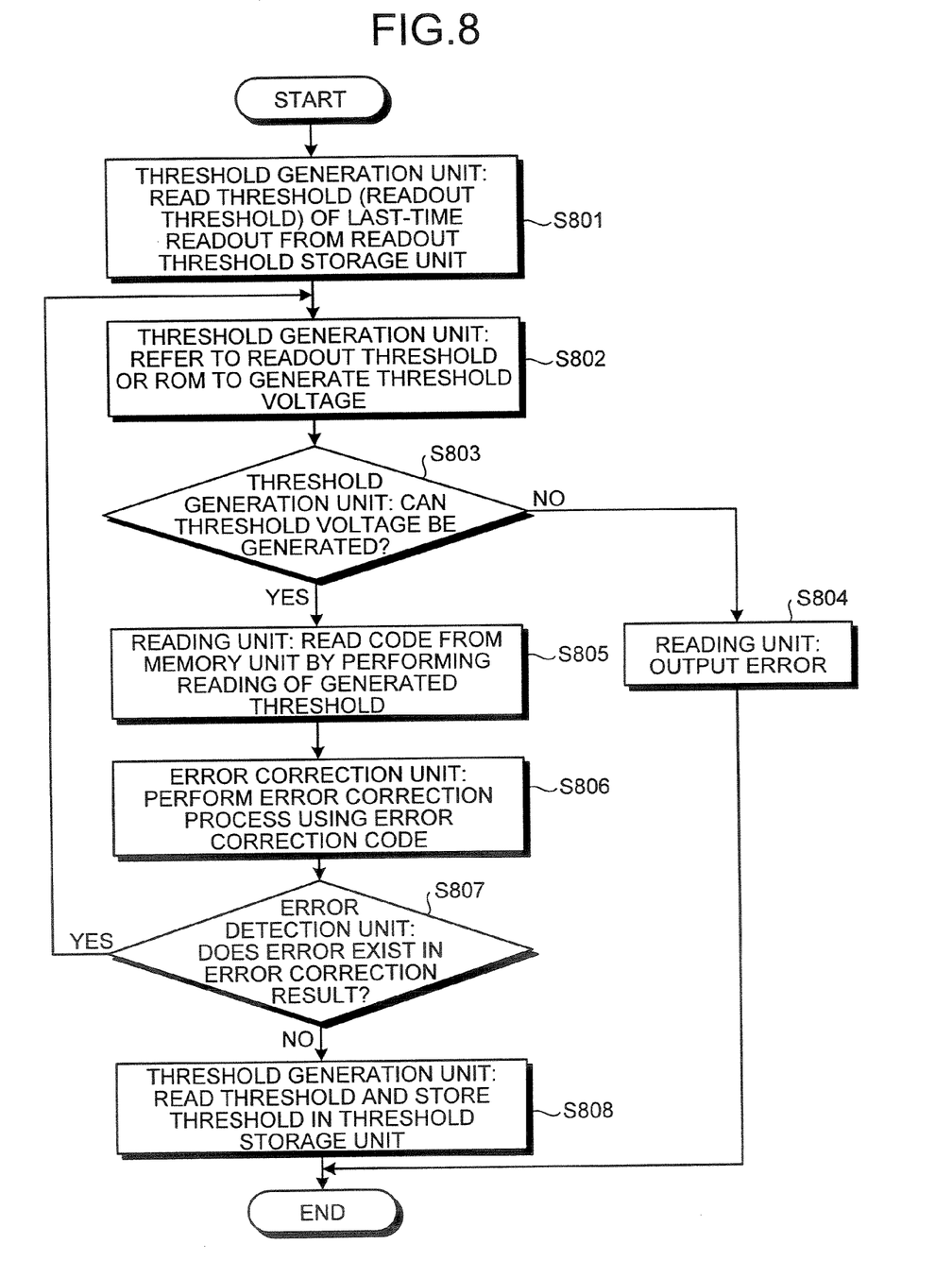
FIG. 8 is a flowchart showing a whole flow of an information readout process in the second embodiment.

An information readout process performed by the apparatus for reproducing information 700 of the second embodiment having the above configuration will be described below. FIG. 8 is a flowchart showing the whole flow of the information readout process in the second embodiment.

The threshold generation unit 707 reads the threshold (hereinafter referred to as readout threshold) which is read from the readout threshold storage unit 711 the last time (Step S801). The threshold generation unit 707 refers to the readout threshold or the ROM 403 to generate the threshold voltage (Step S802).

Specifically the threshold generation unit 707 generates the threshold voltage corresponding to the readout threshold immediately after the readout threshold is read from the readout threshold storage unit 711. When Step S802 is performed again because the information cannot normally be read with the threshold voltage corresponding to the readout threshold, the threshold generation unit 707 refers to the ROM 403 to generate the threshold voltage having the different value.

In the second embodiment, the threshold voltage generation determination process, the comparison process, the error correction process, and the error detection process from Step S803 to Step S807 are similar to the processes from Step S602 to Step S606 in the apparatus for reproducing information 100 of the first embodiment. Therefore, the descriptions of the processes will be not repeated.

In Step S807, when the error detection unit 106 determines that the error does not exist in the result of the error correction process (No in Step S807), the threshold generation unit 707 stores the threshold voltage, used at this moment, in the readout threshold storage unit 711 (Step S808). Then, the information readout process is ended.

In the above process, irrespective of the number of corrections in the error correction, the threshold change is ended at the time when the information is normally read while the error is not detected. However, when the number of error corrections is increased, there is a high possibility that the threshold is required to be changed because the error is generated in the next readout.

Alternatively, even if the information is normally read, the threshold is changed again to repeatedly read the information, the threshold in which the number of error corrections is minimized is determined and stored in the readout threshold storage unit 711, and the threshold is used for the subsequent readouts.

Figure 9:
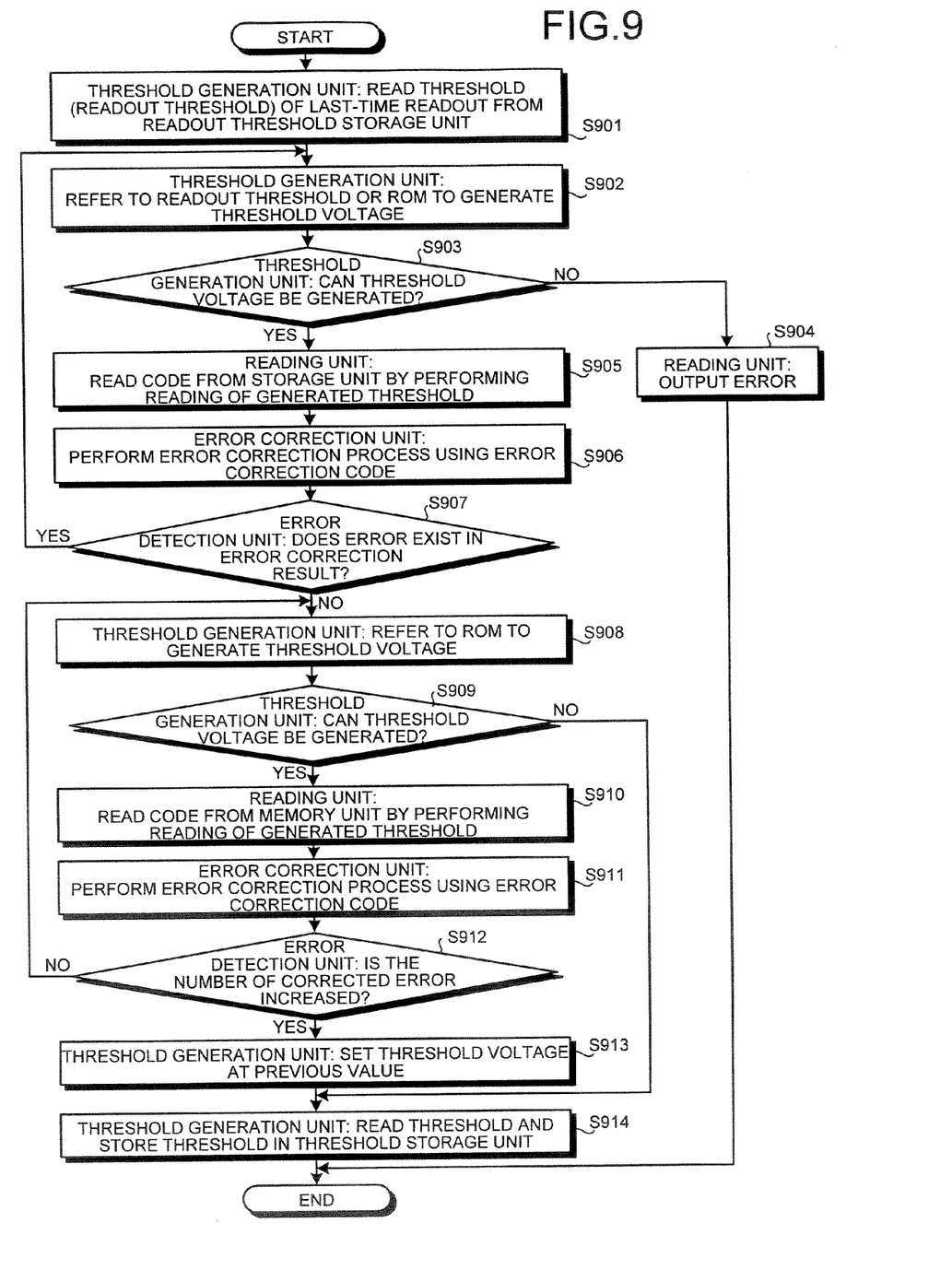
FIG. 9 is a flowchart showing another example of an information readout process in the second embodiment.

The information readout process in the above alternative configuration will be described below. FIG. 9 is a flowchart showing another example of the information readout process in the second embodiment.

The threshold voltage generation process, the threshold voltage generation determination process, the comparison process, the error correction process, and the error detection process from Step S901 to Step S907 are similar to the processes from Step S801 to Step S807 in the example of FIG. 8. Therefore the description of the processes will be not repeated.

In Step S907, when the error detection unit 106 determines that the error does not exist in the result of the error correction process (No in Step S907), the threshold generation unit 707 refers to the ROM 403 to generate the threshold voltage different from the threshold voltage used at this moment (Step S908). Specifically the threshold generation unit 707 obtains the threshold voltage having the value smaller than that of the threshold voltage used at this moment, and the threshold generation unit 707 generates the threshold voltage with the obtained value.

The threshold generation unit 707 determines whether the threshold voltage can be generated or not (Step S909). When the threshold voltage cannot be generated (No in Step S909), the threshold generation unit 707 stores the threshold voltage value in the readout threshold storage unit 711 (Step S914). Then, the information readout process is ended.

When the threshold voltage can be generated (Yes in Step S909), the comparison process and the error correction process in Step S910 and Step S911 are performed. The comparison process and the error correction process in Step S910 and Step S911 are similar to the processes in Step S905 and Step S906 of FIG. 9, so that the description will be not repeated.

After the error correction unit 105 performs the error correction process in Step S911, the error detection unit 106 determines whether the number of corrected errors is increased or not (Step S912). Specifically, the error detection unit 106 determines whether the number of corrected errors is increased or not by comparing the number of errors corrected in the error correction process performed at this time to the number of errors corrected in the error correction process performed in Step S906 or the number of errors corrected in the error correction process performed the last time.

When the error detection unit 106 determines that the number of corrected errors is not increased (No in Step S912), the threshold generation unit 707 obtains the threshold voltage having the value different from that of the current threshold voltage from the ROM 403, and the threshold generation unit 707 newly generates the threshold voltage (Step S908), and the information readout process is repeated.

When the error detection unit 106 determines that the number of corrected errors is increased (Yes in Step S912), the threshold generation unit 707 set the threshold voltage at the previous value (Step S913), and the threshold generation unit 707 stores the threshold voltage in the readout threshold storage unit 711 (Step S914). Then, the readout process is ended.

This is because that the threshold voltage is excessively decreased can be determined from the increase of the number of errors. Thus, the threshold in which the number of error corrections is minimized can be determined. The threshold in which the number of error corrections is minimized is used for the subsequent readouts, which allows the number of trial times reaching to the optimum threshold voltage to be further decreased.

Thus, in the apparatus for reproducing information of the second embodiment, the threshold when the error is not detected in the readout information is stored in the memory unit, and the threshold is referred to in the subsequent readouts. Therefore, the speedup of the determination process and the information readout process can be achieved for the threshold normally read.

In an apparatus for reproducing information according to a third embodiment, the refresh operation in which the charge amount is held at the normal value is performed when the threshold is smaller than a predetermined reference value in normally reading the information.

Figure 10:
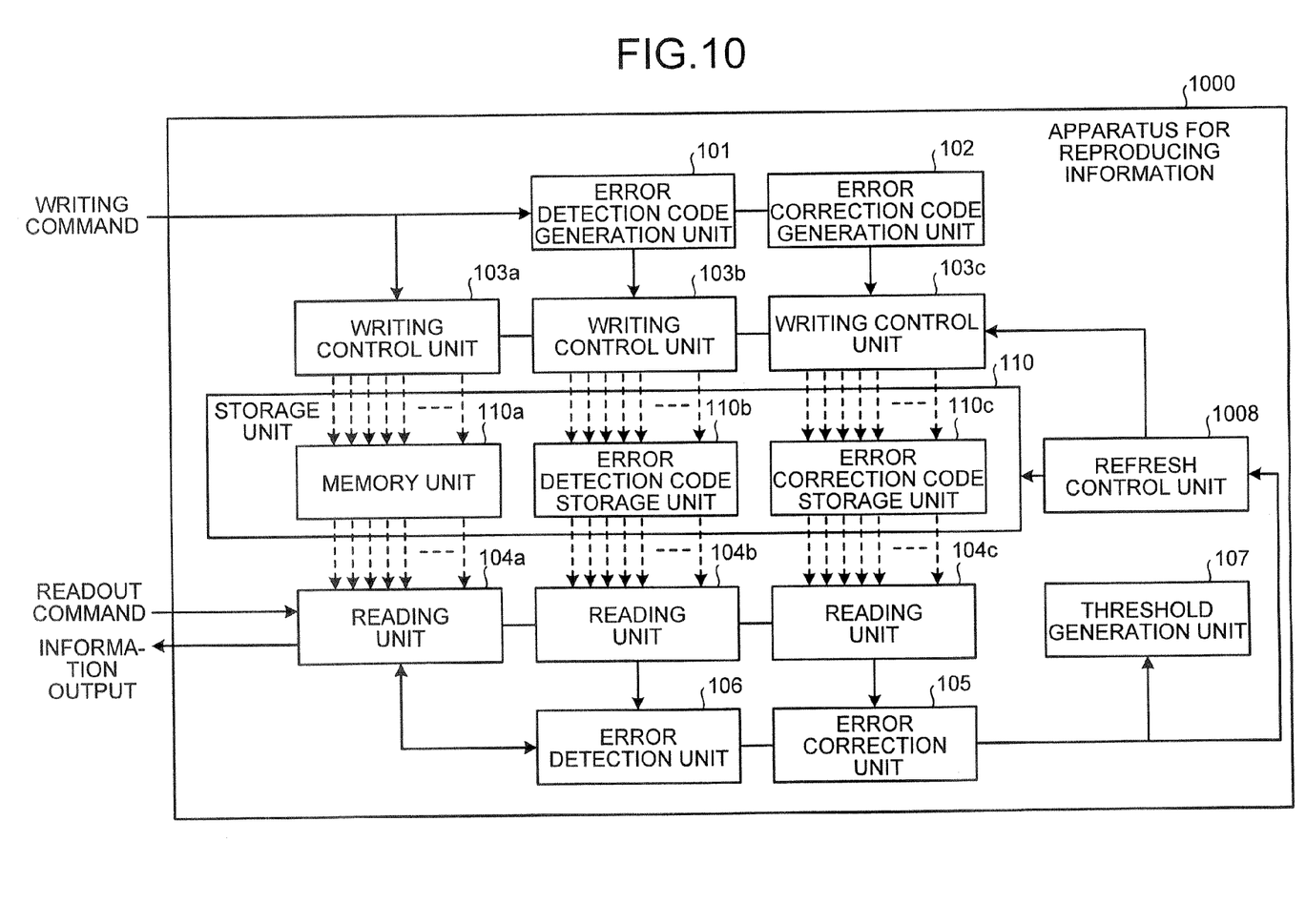
FIG. 10 is a block diagram showing a configuration of an apparatus for reproducing information according to a third embodiment.

FIG. 10 is a block diagram showing a configuration of an apparatus for reproducing information 1000 according to a third embodiment. As shown in FIG. 10, the apparatus for reproducing information 1000 includes the memory unit 110, the error detection code generation unit 101, the error correction code generation unit 102, the writing control units 103a to 103c, the reading units 104a to 104c, the error correction unit 105, the error detection unit 106, the threshold generation unit 107, and a refresh control unit 1008.

The third embodiment differs from the first embodiment in that the refresh control unit 1008 is added. Other configurations and functions are similar to those of the block diagram of FIG. 1 which shows the configuration of the apparatus for reproducing information 100 of the first embodiment. Therefore, the same component is designated by the same reference numeral, and the description will be not repeated.

The refresh control unit 1008 performs the refresh operation in which the charge amount of the memory unit 110 is held at the normal value when the threshold is smaller than the predetermined reference value in normally reading the information. Even when the information can normally be read, when the threshold is low, it is estimated that a margin for being able to separate the codes is decreased. Therefore, it is necessary that the error generation be avoided in the readout.

Figure 11:
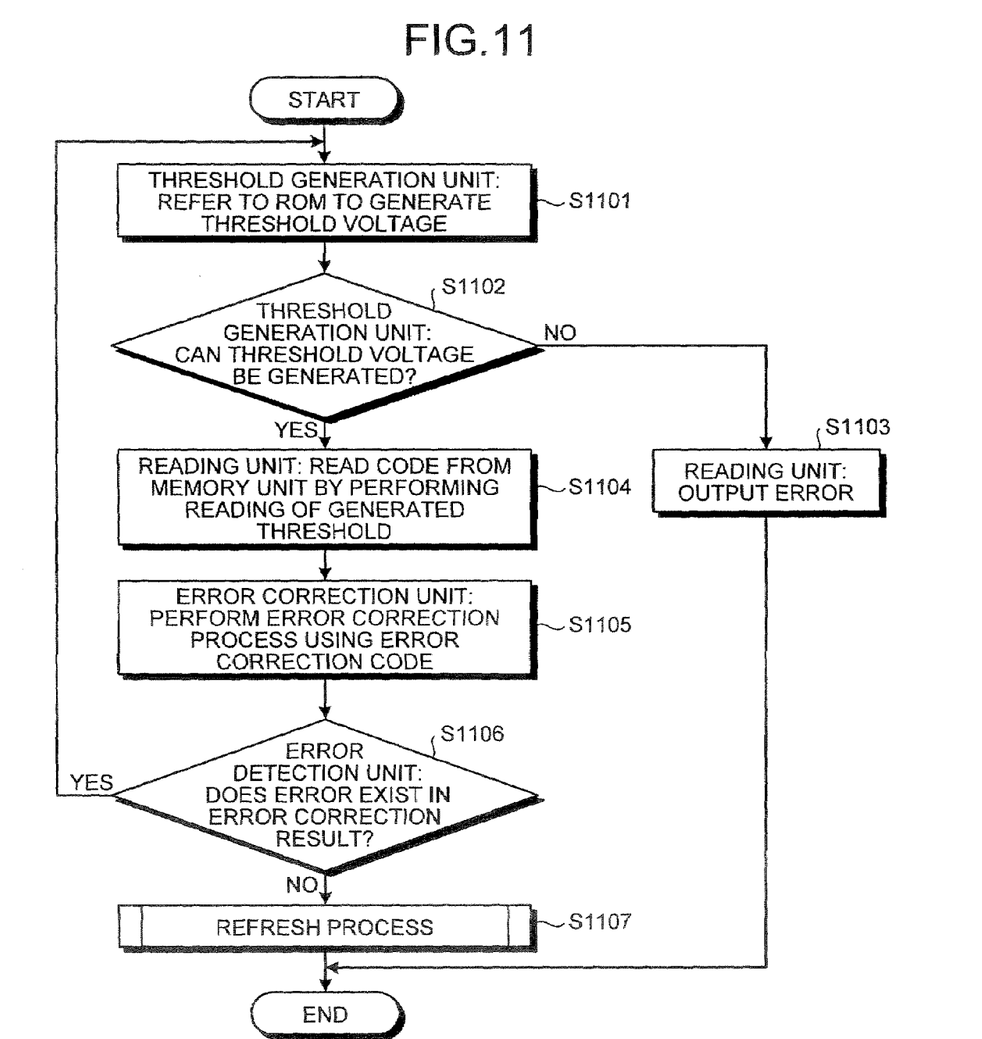
FIG. 11 is a flowchart showing a whole flow of an information readout process in the third embodiment.

An information readout process performed by the apparatus for reproducing information 1000 of the third embodiment having the above configuration will be described below. FIG. 11 is a flowchart showing the whole flow of the information readout process in the third embodiment.

The threshold voltage generation process, the threshold voltage generation determination process, the comparison process, the error correction process, and the error detection process from Step S1101 to Step S1106 are similar to the processes from Step S601 to Step S606 in the apparatus for reproducing information 100 of the first embodiment. Therefore, the descriptions of the processes will be not repeated.

The third embodiment differs from the first embodiment in that the refresh process is performed if needed in the end of the information readout process (Step S1107).

Figure 12:
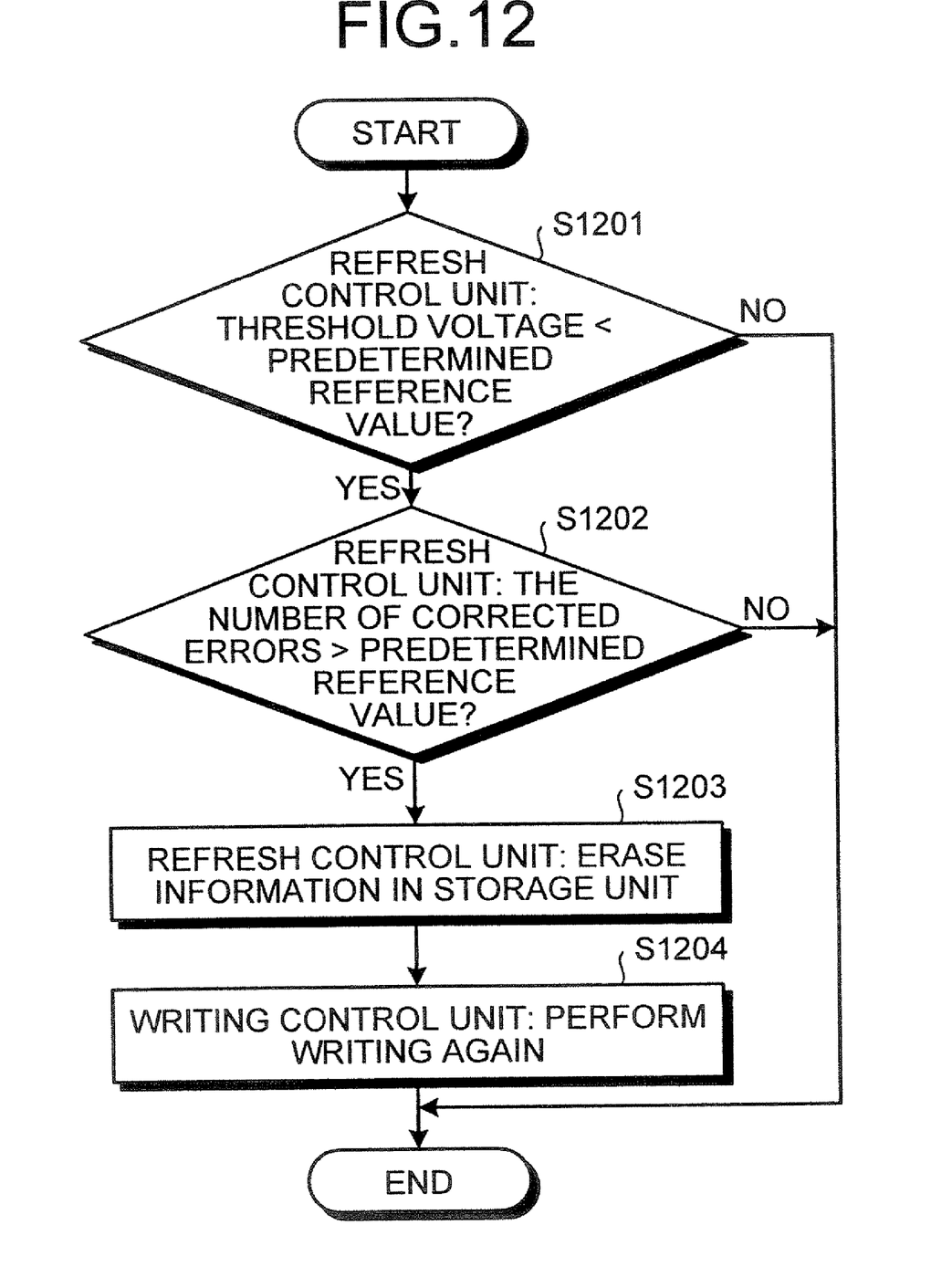
FIG. 12 is a flowchart showing a whole flow of a refresh process.

The refresh process shown in Step S1107 will be described in detail. FIG. 12 is a flowchart showing the whole flow of the refresh process.

The refresh control unit 1008 determines whether the threshold voltage used in reading the information is smaller than the predetermined reference value or not (Step S1201). When the threshold voltage is not smaller than the reference value (No in Step S1201), because the refresh operation is not required, the refresh process is ended.

When the threshold voltage is smaller than the reference value (Yes in Step S1201), the refresh control unit 1008 determines whether the number of corrected errors is larger than another predetermined reference value or not (Step S1202).

In the case of the use of the error correction code in which many errors can be corrected, when the determination of the refresh operation is made only by the threshold, there is a possibility that the refresh operation is excessively performed. Therefore, in Step S1202, when the number of corrected errors is small, the determination is made such that the refresh operation is not performed.

When the refresh control unit 1008 determines that the number of corrected errors is not larger than the reference value (No in Step S1202), because the refresh operation is not required, the refresh process is ended.

The apparatus for reproducing information 1000 of the third embodiment may be configured to determine where the refresh operation is required or not only by the threshold voltage without determining the number of corrected error.

In Step S1202, when the refresh control unit 1008 determines that the number of corrected errors is larger than the reference value (Yes in Step S1202), the refresh control unit 1008 erases the information of the memory unit 110 (Step S1203). In the case of a kind of memory device in which it is necessary that the information be not erased before writing, Step S1203 can be omitted.

The writing control units 103*a* to 103*c* write the information, to which the error correction is performed, in the memory unit 110 (Step S1204). Then, the refresh process is ended.

Thus, in the apparatus for reproducing information of the third embodiment, when the threshold is smaller than the predetermined reference value in normally reading the information, the refresh operation in which the charge amount is held at the normal value can be performed. Whether the refresh operation is performed or not can be determined by considering whether the number of error corrections is larger than the predetermined reference value. Therefore, the charge amount can properly be kept, and the period during which the information can normally be read and the readout number can be increased.

A program for reproducing information executed by the pieces of apparatus for reproducing information according to the first to third embodiments is provided while previously incorporated in ROM or the like.

The storage medium reproducing program executed by the pieces of apparatus for reproducing information according to the first to third embodiments may be configured to be provided while recorded in a recording medium, such as a CD-ROM (Compact Disk Read Only Memory), a flexible disk (FD), a CD-R (Compact Disk Recordable), and a DVD (Digital Versatile Disk), which can be read with a computer in a file of an installable form or an executable form.

The storage medium reproducing program executed by the pieces of apparatus for reproducing information according to the first to third embodiments may be configured to be provided by storing the storage medium reproducing program in the computer connected to a network such as the Internet and by downloading the storage medium reproducing program through the network. The storage medium reproducing program executed by the pieces of apparatus for reproducing information according to the first to third embodiments may be configured to be provided or distributed through network such as the Internet.

The storage medium reproducing program executed by the pieces of apparatus for reproducing information according to the first to third embodiments is formed in a module configuration including the above units (error detection code generation unit, error correction code generation unit, writing control unit, reading unit, error correction unit, error detection unit, threshold generation unit, and refresh control unit). In actual hardware, a CPU (Central Processing Unit) reads the storage medium reproducing program from ROM to execute the storage medium reproducing program, and thereby the above units is loaded on the main storage device to generate the units on the main storage device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for reproducing information, comprising:
    a memory unit which stores charge;
    a reading unit which obtains an amount of the charge stored in the memory unit, and reads information by determining a value based on a comparison of the amount of the charge with a first threshold;
    an error detection unit which determines whether the information read has an error; and a threshold generation unit which generates a second threshold having a value different from that of the first threshold used in reading the information, when the error detection unit determines that the information has an error, wherein the reading unit further reads the information by determining a value based on a comparison of the amount of the charge with the second threshold after the error detection unit determines that the information has the error.

2. The apparatus for reproducing information according to claim 1, further comprising a threshold candidate storage unit which stores a plurality of predetermined thresholds, wherein the threshold generation unit obtains one of the predetermined thresholds stored in the threshold candidate storage unit, and generates the one of the predetermined thresholds as the second threshold, when the error detection unit determines that the information has the error.

3. The apparatus for reproducing information according to claim 2, wherein the threshold generation unit obtains a threshold from the threshold candidate storage unit, the threshold being smaller than the first threshold used in reading the information, and generates the threshold as the second threshold, when the error detection unit determines that the information has the error.

4. The apparatus for reproducing information according to claim 2, wherein the threshold candidate storage unit stores an initial threshold used when a charge accumulated in the memory unit is not discharged and a plurality of thresholds previously determined according to discharge characteristics of the charge and each smaller than the initial threshold, and the threshold generation unit obtains a threshold smaller than the first threshold used in reading the information from the threshold candidate storage unit, and generates the threshold as the second threshold, when the error detection unit determines that the information has the error.

5. The apparatus for reproducing information according to claim 1, further comprising an error correction unit which performs error correction on the information read, wherein the error detection unit determines whether the information corrected has an error.

6. The apparatus for reproducing information according to claim 1, further comprising a readout threshold storage unit which stores the first threshold used in reading the information, wherein the threshold generation unit stores the first threshold used in reading the information in the readout threshold storage unit, when the error detection unit determines that the information has no error, and the reading unit reads the first threshold stored in the readout threshold storage unit, and reads information by determining a value based on a comparison of the amount of the charge with the first threshold read.

7. The apparatus for reproducing information according to claim 6, wherein the threshold generation unit obtains a threshold smaller than the first threshold used in reading the information from the threshold candidate storage unit, and generates the threshold as the second threshold, when the error detection unit determines that the information has the error.

8. The apparatus for reproducing information according to claim 7, wherein the threshold candidate storage unit stores an initial threshold used when a charge accumulated in the memory unit is not discharged and a plurality of thresholds previously determined according to discharge characteristics of the charge and each smaller than the initial threshold, the threshold generation unit obtains a threshold smaller than the first threshold used in reading the information from the threshold candidate storage unit, and generates the threshold as the second threshold, when the error detection unit determines that the information has the error.

9. The apparatus for reproducing information according to claim 6, further comprising an error correction unit which performs error correction on the information read, wherein the error detection unit determines whether the number of errors which are corrected to the information read with the second threshold by the error correction unit is increased compared with the number of errors which are corrected to the information read with the first threshold by the error correction unit, the threshold generation unit stores the first threshold in the readout threshold storage unit when the error detection unit determines that the number of errors is increased, and generates a third threshold different from the second threshold when the error detection unit determines that the number of errors is not increased, and the reading unit further reads the information by determining a value based on a comparison of the amount of the charge with the third threshold after the error detection unit determines that the number of errors is not increased.

10. The apparatus for reproducing information according to claim 1, further comprising a refresh control unit which compares the first threshold with a first reference value when the error detection unit determines that the information has no error, and performs a refresh operation keeping the charge amount of the memory unit at a normal value when the first threshold is smaller than the first reference value.

11. The apparatus for reproducing information according to claim 10, further comprising an error correction unit which performs error correction to the information read by the reading unit, wherein the refresh control unit compares the number of corrected errors with a second reference value when the refresh control unit determines that the first threshold is smaller than the first reference value, and performs the refresh operation when the number of corrected errors is larger than the second reference value.

12. A method for reproducing information comprising:

obtaining an amount of the charge stored in a memory unit which stores charge;

reading information by determining a value based on a comparison of the amount of the charge with a first threshold;

determining whether the information read has an error;

generating a second threshold different from the first threshold used in reading the information when it is determined that the information has the error; and reading the information by determining a value based on a comparison of the amount of the charge with the second threshold after it is determined that the information has the error.

13. A computer program product having a computer readable medium including programmed instructions for reproducing information in a storage medium, wherein the instructions, when executed by a computer, cause the computer to perform:

obtaining an amount of the charge stored in a memory unit which stores charge;

reading information by determining a value based on a comparison of the amount of the charge with a first threshold;

determining whether the information read has an error;

generating a second threshold different from the first threshold used in reading the information when it is determined that the information has the error; and reading the information by determining a value based on a comparison of the amount of the charge with the second threshold after it is determined that the information has the error.

* * * * *